United States Patent
Gealy et al.

(10) Patent No.: US 7,279,435 B2
(45) Date of Patent: *Oct. 9, 2007

(54) APPARATUS FOR STABILIZING HIGH PRESSURE OXIDATION OF A SEMICONDUCTOR DEVICE

(75) Inventors: Daniel F. Gealy, Kuna, ID (US); Dave Chapek, Merrimack, NH (US); Scott DeBoer, Boise, ID (US); Husam N. Al-Shareef, Tustin, CA (US); Randhir Thakur, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/933,890

(22) Filed: Sep. 2, 2004

(65) Prior Publication Data

US 2005/0028936 A1    Feb. 10, 2005

Related U.S. Application Data

(60) Continuation of application No. 09/798,445, filed on Mar. 2, 2001, which is a division of application No. 09/386,941, filed on Aug. 31, 1999, now Pat. No. 6,291,364.

(51) Int. Cl.
*H01L 21/469*    (2006.01)
*H01L 21/42*    (2006.01)

(52) U.S. Cl. .................. 438/800; 438/770; 118/725; 257/E21.268

(58) Field of Classification Search ............. 118/724, 118/725; 438/469, 770, 800, 903
See application file for complete search history.

(56) References Cited

U.S. PATENT DOCUMENTS

| | | | |
|---|---|---|---|
| 5,382,533 A | | 1/1995 | Ahmad et al. |
| 5,383,421 A | * | 1/1995 | Dunmead et al. ............... 117/4 |
| 5,416,045 A | | 5/1995 | Kauffman et al. |
| 5,479,955 A | | 1/1996 | Roodvoets et al. |
| 5,508,221 A | | 4/1996 | Kamiyama |
| 5,569,936 A | | 10/1996 | Zhang et al. |
| 5,595,923 A | | 1/1997 | Zhang et al. |
| 5,595,944 A | | 1/1997 | Zhang et al. |
| 5,606,179 A | | 2/1997 | Yamazaki et al. |
| 5,624,865 A | | 4/1997 | Schuegraf et al. |

(Continued)

OTHER PUBLICATIONS

*Nitraded Oxides*, Silicon Processing for the VLSI Era—vol. III, pp. 648-661.

*Primary Examiner*—Alexander Ghyka
(74) *Attorney, Agent, or Firm*—TraskBritt

(57) ABSTRACT

A method and apparatus for preventing $N_2O$ from becoming super critical during a high pressure oxidation stage within a high pressure oxidation furnace are disclosed. The method and apparatus utilize a catalyst to catalytically disassociate $N_2O$ as it enters the high pressure oxidation furnace. This catalyst is used in an environment of between five (5) atmospheres to twenty-five (25) atmospheres $N_2O$ and a temperature range of 600° C. to 750° C., which are the conditions that lead to the $N_2O$ going super critical. By preventing the $N_2O$ from becoming super critical, the reaction is controlled that prevents both temperature and pressure spikes. The catalyst can be selected from the group of noble transition metals and their oxides. This group can comprise palladium, platinum, iridium, rhodium, nickel, silver, and gold.

70 Claims, 1 Drawing Sheet

U.S. PATENT DOCUMENTS

| | | |
|---|---|---|
| 5,646,075 A | 7/1997 | Thakur et al. |
| 5,646,424 A | 7/1997 | Zhang et al. |
| 5,783,335 A | 7/1998 | Laia, Jr. et al. |
| 5,840,600 A * | 11/1998 | Yamazaki et al. .......... 438/151 |
| 6,291,364 B1 | 9/2001 | Gealy et al. |
| 6,407,419 B1 | 6/2002 | Okudaira |
| 6,423,649 B2 | 7/2002 | Gealy et al. |
| 6,596,651 B2 | 7/2003 | Gealey et al. |
| 2005/0279283 A1 * | 12/2005 | Gealy et al. ................. 118/724 |

* cited by examiner

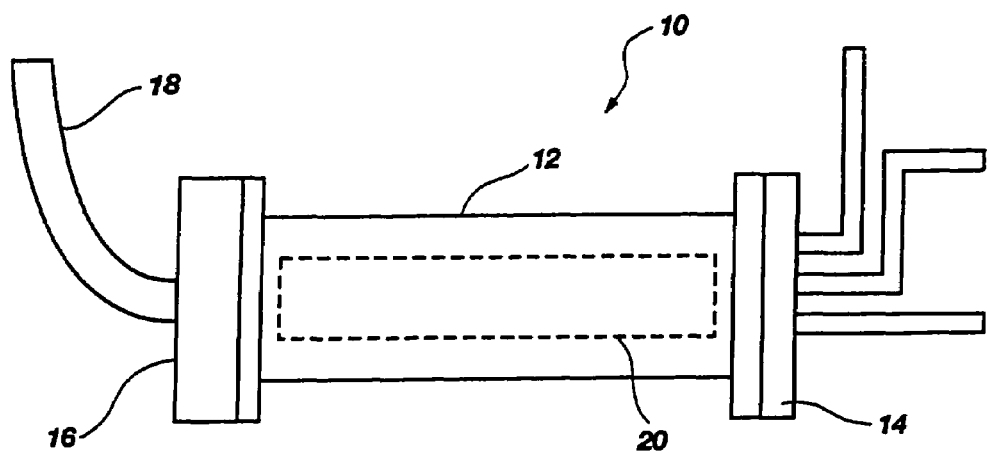
Fig. 1
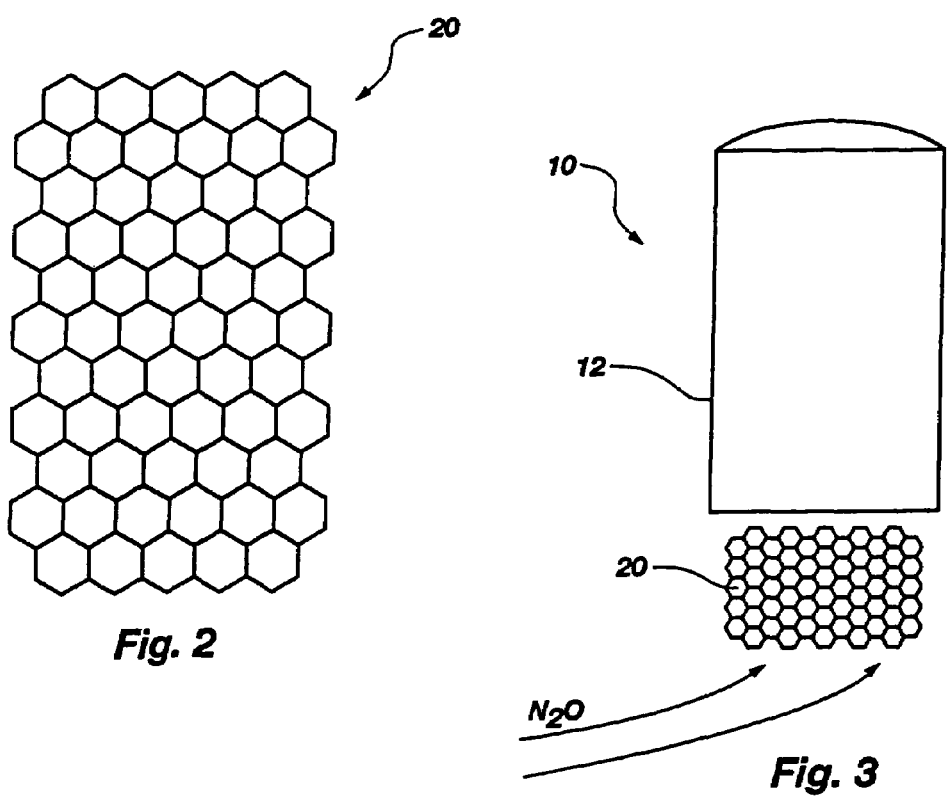
Fig. 2
Fig. 3

APPARATUS FOR STABILIZING HIGH PRESSURE OXIDATION OF A SEMICONDUCTOR DEVICE

CROSS-REFERENCE TO RELATED APPLICATIONS

This application is a continuation of application Ser. No. 09/798,445, filed Mar. 2, 2001, which is a divisional of application Ser. No. 09/386,941, filed Aug. 31, 1999, now U.S. Pat. No. 6,291,364, issued Sep. 18, 2001.

BACKGROUND OF THE INVENTION

The present invention relates generally to oxidizing a semiconductor surface during an anneal processing step and, more particularly, the present invention relates to stabilizing a high pressure oxidation step using nitrous oxide gas within a temperature range of 600° C. to 750° C.

Advanced semiconductor devices, such as high density dynamic random access memories ("DRAMs"), impose severe restrictions on the times, temperatures, and atmospheres of all thermal process steps. DRAMs are comprised of a plurality of memory cells. Each memory cell is further comprised of a field effect transistor and a capacitor. It is well known in the art of semiconductor fabrication to use planar capacitors within DRAM cells; however, in DRAM cells that utilize conventional planar capacitors, more integrated circuit surface area is dedicated to the planar capacitor than to the field effect transistor.

As the density of components in integrated circuit memories increased, the shrinkage of memory cell size resulted in a number of other problems in addition to the problems associated with a smaller capacitor. Among the resulting problems was that of dopant diffusing out of the semiconductor material when forming the transistors of the memory cells. In order to form transistors, dopants must be implanted in regions of the semiconductor materials. The dopant, however, tends to diffuse out of the transistor regions when the transistors are heated during subsequent integrated circuit processing steps. For example, dopant diffuses from the semiconductor material during the reoxidation anneal of the dielectric layer of the cell capacitor.

Silicon nitride is used as a dielectric layer because it has less desirable leakage current properties than silicon dioxide. Further, a thin oxide layer is grown upon the dielectric layer by reoxidizing a layer of silicon nitride enough to form this oxide layer to further reduce the leakage current of the silicon nitride film.

Once the proper amount of silicon oxide and nitride oxide have been grown upon the surface to form the dielectric layer, a reoxidation anneal step is necessary to reduce the imperfections typically occurring during the initial reoxidation growth stages.

One method to provide the silicon dioxide film is to perform a high pressure chemical vapor deposition (HPCVD) process step on the semiconductor device. The formation of the cell dielectric, as well as transistor gate oxides and reoxidation steps in other processing application steps, is subjected to high pressures in excess of one atmosphere, typically between five (5) atmospheres to twenty-five (25) atmospheres, where an atmosphere is represented as a pressure of 760 Torr. An atmosphere of pure $N_2O$ is introduced under such pressures in a temperature range of 600° C. to 800° C. The desired reaction is:

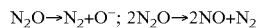

This allows the oxygen to react with the silicon surface, forming the silicon dioxide layer.

Unfortunately, as the $N_2O$ reaction proceeds, it can become uncontrollable under certain circumstances; specifically, the $N_2O$ reaction can become supercritical, which gives rise to high pressure spikes within the high pressure oxidation furnace. These high pressure spikes abort the high pressure furnace runs and prevent the furnaces from operating in pure $N_2O$ in the temperature range of 600° C. to 750° C. As the concentration of unreacted $N_2O$ builds up in the high pressure oxidation furnace, it reaches a critical point where the disassociation reaction is self-propitiating. This reaction goes from:

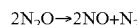

Once the concentration of unreacted $N_2O$ exceeds this critical point, the uncontrolled reaction occurs and generates pressure spikes that may explode a furnace tube of the high pressure oxidation furnace. An exploding furnace tube results in ruined product as well as dangerous working environment conditions for personnel.

Accordingly, a method and apparatus are needed that reduce, if not prevent, the unreacted $N_2O$ from becoming super critical to ensure the uniform processing of the semiconductor wafers.

BRIEF SUMMARY OF THE INVENTION

According to the present invention, a method and apparatus for preventing $N_2O$ from becoming super critical during a high pressure oxidation stage within a high pressure oxidation furnace are disclosed. The method and apparatus utilize a catalyst to catalytically disassociate $N_2O$ as it enters the high pressure oxidation furnace. This catalyst is used in an environment of between five (5) atmospheres to twenty-five (25) atmospheres $N_2O$ and a temperature range of 600° C. to 750° C., which are the conditions that lead to the $N_2O$ going super critical. By preventing the $N_2O$ from becoming super critical, the reaction is controlled such that it prevents both temperature and pressure spikes. The catalyst can be selected from the group of noble transition metals and their oxides. This group can comprise Palladium, Platinum, Iridium, Rhodium, Nickel, Silver, and Gold.

BRIEF DESCRIPTION OF THE DRAWINGS

FIG. 1 depicts a block diagram of a high-pressure furnace with a catalytic matrix sleeve inserted therein;

FIG. 2 depicts a grid arrangement of the catalytic matrix sleeve used in FIG. 1; and FIG. 3 depicts a high pressure furnace that uses a catalytic matrix screen in an alternative embodiment.

DETAILED DESCRIPTION OF THE INVENTION

With reference to drawing FIG. 1, a high pressure furnace 10 for chemical vapor deposition is illustrated. The furnace 10 comprises a reactor vessel or furnace tube 12 and a front and rear flange assembly 14 and 16, respectively. Wafers are positioned within furnace tube 12. Front flange assembly 14 includes various gas inlets. The gas inlets terminate right at the front flange assembly 14. Gas is injected into furnace tube 12 and immediately adjacent the inlet flange. An exhaust port 18 connects to a suitable pump for exhausting gases from furnace tube 12. Placed within furnace tube 12 is a catalyst matrix liner 20 that is comprised of a catalyst element that catalyzes $N_2O$ gas dissociation as the gas enters the furnace tube 12.

Furnace 10 operates under high pressure and temperatures. The pressure is above one atmosphere and ranges from five (5) atmospheres to twenty-five (25) atmospheres. The temperature range is from 600° C. to 750° C. These pressures and temperatures can be greater or less, with a transition through the stated temperature range. The importance of using catalyst matrix liner 20 is to protect against pressure and temperature spiking occurring within the furnace tube 12 of the furnace 10 during such pressure and temperature ranges of operation of the furnace 10.

Catalyst matrix liner 20, which is also shown in drawing FIG. 2, is comprised of a catalyzing agent that causes the $N_2O$ gas in the furnace 10 to react to form the base components of nitrogen and oxygen of the $N_2O$ gas according to the following reaction:

$$N_2O \rightarrow N_2 + O^- + \text{Catalyst}$$

The use of the catalyst constrains the chemical reaction from running away or becoming uncontrollable, which would cause a pressure and temperature surge within the furnace 10. Such surges must be avoided as they destroy the semiconductor materials under fabrication within the furnace 10 as well as cause the possible destruction of the furnace tube 12.

Catalyst materials are selected from the group consisting of Palladium, Platinum, Iridium, Rhodium, Nickel, and Silver. Gold also can be used as a catalyst, but should be avoided as gold contaminates the silicon used in the wafers on which semiconductor devices are formed. Additional catalysts include perovskites, $CaTiO_3$, a natural or synthetic crystalline mineral composed of calcium dioxide and titanium dioxide. When using a Tantalum compound to form the gate oxide or the cell dielectric for the transistors of a semiconductor device, a tantalum oxide is produced in the $N_2O$ atmosphere in the furnace 10. The oxygen from the $N_2O$ combines with the tantalum oxide according to the following reaction:

$$2TaO_x + O_2 \rightarrow Ta_2O_5 + \text{Catalyst}$$

The use of the catalyst material helps to drive this reaction nearly to full stoichiometry. When used with a Barium Strontium Titanate compound, the catalyst allows the oxidation to produce:

$$Ba_xSr_{1-x}TiO_3$$

which is driven to a full stoichiometry reaction as well.

The catalyst matrix liner 20 of drawing FIG. 2 is shown to be in a honeycomb or hexagonal geometry. This particular geometry is used because of its ease of manufacture and its strength and stability. Other geometric shapes are also possible, such as, for example, circles, ovals, rectangles, diamonds, and other various types of polygonal shapes. Referring to drawing FIG. 3, illustrated is an alternative embodiment of catalyst matrix liner 20 with respect to its location within furnace 10. In this embodiment, catalyst matrix liner 20 is placed next to the gas inlets of front flange assembly 14 (see FIG. 1). This position allows for the nitrous oxide to strike the catalyst matrix liner 20 as the gas enters the furnace chamber or tube 12 of furnace 10. Again, as stated previously, the contents of furnace 10 in drawing FIG. 3 are under high pressure and temperatures as described herein.

The catalyst matrix liner 20 can be made having a honeycomb or hexagonal base or supporting material base from a material, such as stainless steel, which is subsequently plated with the desired catalytic material as described herein. Other well known materials may be used for the honeycomb or hexagonal catalyst matrix liner that are suitable for such use as a substitute for stainless steel include aluminum oxide, or other suitable structural ceramics where the catalyst is embedded therein.

The furnace 10 is useful during gate oxidation in growing either a nitride layer or an oxide layer, or both. Further, cell dielectric layers can also be oxidized under safe conditions using the furnace 10. Additionally, reoxidation can be performed safely under the desired temperature and pressure constraints as described herein within the furnace 10. The advantages of using high pressures within the stated temperature range is that the semiconductor material is not subjected to the high heat loads of temperature in excess of 800° C., which can warp and damage the wafers as well as inhibit the oxide growth layer. Additionally, the reactions within the furnace 10 can be easily controlled during operation without undesired reactions occurring. Additionally, the high pressure oxidation process minimizes the time the wafers are subjected to high temperatures and helps to minimize any undesirable diffusion of dopants whose rate of diffusion increases with increases in temperature.

While the preferred embodiments of the present invention have been described above, the invention defined by the appended claims is not to be limited by particular details set forth in the above description, as many apparent variations thereof are possible without departing from the spirit or scope thereof.

What is claimed is:

1. A furnace for semiconductor material comprising:
   a furnace tube having an interior surface for receiving and processing semiconductor material therein operable in a predetermined range of temperature and a predetermined range of pressure;
   a gas feed coupled to the furnace tube for introducing a gas into the furnace tube; and
   a catalyst matrix located within the furnace tube for contacting the gas comprising a tube liner extending along a portion of the furnace tube having an opening therein.

2. The furnace according to claim 1, wherein the predetermined range of temperature includes 600° C. and 750° C.

3. The furnace according to claim 1, wherein the tube liner comprises:
   a tube liner placed along a portion of a length of the interior surface of the furnace tube.

4. The furnace according to claim 1, wherein the tube liner comprises:
   a base material having a plurality of openings formed therein; and
   a catalyst material covering a portion of the base material.

5. The furnace according to claim 1, wherein the base material comprises stainless steel.

6. The furnace according to claim 1, wherein the catalyst material is selected from the group consisting of lead, platinum, iridium or palladium.

7. The furnace according to claim 1, wherein the catalyst material is selected from the group consisting of rhodium, nickel, or silver.

8. The furnace according to claim 1, wherein the predetermined pressure includes the range of about five atmospheres to about twenty five atmospheres.

9. The furnace according to claim 1, wherein the predetermined pressure is at least five atmospheres.

10. The furnace according to claim 1, further comprising a gas outlet connected to the furnace tube.

11. A fabrication furnace for semiconductor material comprising:
a furnace tube having an interior surface for receiving and processing semiconductor material therein operable in a predetermined range of temperature and a predetermined range of pressure from about five atmospheres;
a gas feed coupled to the furnace tube introducing a gas into the furnace tube;
a catalyst matrix located within a tube liner within the furnace tube contacting the gas; and
a gas outlet coupled to the furnace tube for removing gas therefrom.

12. The furnace according to claim 11, wherein the predetermined range of temperature includes 600° C. and 750° C.

13. The furnace according to claim 11, wherein the catalyst matrix comprises:
a tube liner placed along a portion of a length of the interior surface of the furnace tube, the tube liner including a plurality of openings therein.

14. The furnace according to claim 11, wherein a tube liner comprises:
a base material having a plurality of openings formed therein; and
a catalyst material covering a portion of the base material.

15. The furnace according to claim 14, wherein the base material is formed in a honeycomb configuration.

16. The furnace according to claim 14, wherein the base material is formed in a hexagonal configuration.

17. The furnace according to claim 14, wherein the base material comprises stainless steel.

18. The furnace according to claim 14, wherein the base material comprises a structural ceramic.

19. The furnace according to claim 14, wherein the catalyst material is selected from the group consisting of lead, platinum, iridium or palladium.

20. The furnace according to claim 14, wherein the catalyst material is selected from the group consisting of rhodium, nickel, or silver.

21. The furnace according to claim 11, wherein the predetermined pressure includes the range of about five atmospheres to about twenty five atmospheres.

22. The furnace according to claim 11, wherein the predetermined pressure is at least five atmospheres.

23. The furnace according to claim 11, further comprising: a gas outlet connected to the furnace tube.

24. A fabrication furnace for semiconductor material comprising:
a furnace tube having an interior surface for receiving and processing semiconductor material therein operable in a predetermined range of temperature from about 600° C. to about 750° C. and a predetermined range of pressure;
a gas feed coupled to the furnace tube introducing $N_2O$ gas into the furnace tube;
a catalyst matrix located within a tube liner within the furnace tube contacting the $N_2O$ gas introduced into the furnace tube; and
a gas outlet coupled to the furnace tube for removing the $N_2O$ gas therefrom.

25. The furnace according to claim 24, wherein the predetermined range of temperature includes 600° C. and 750° C.

26. The furnace according to claim 24, wherein the catalyst matrix comprises:
a tube liner placed along a portion of length of the interior surface of the furnace tube, the tube liner including a plurality of openings therein.

27. The furnace according to claim 24, wherein a tube liner comprises:
a base material having a plurality of openings formed therein; and
a catalyst material covering a portion of the base material.

28. The furnace according to claim 27, wherein the base material is formed in a honeycomb configuration.

29. The furnace according to claim 27, wherein the base material is formed in a hexagonal configuration.

30. The furnace according to claim 27, wherein the base material comprises stainless steel.

31. The furnace according to claim 27, wherein the base material comprises a structural ceramic.

32. The furnace according to claim 27, wherein the catalyst material is selected from the group consisting of lead, platinum, iridium or palladium.

33. The furnace according to claim 27, wherein the catalyst material is selected from the group consisting of rhodium, nickel, or silver.

34. The furnace according to claim 24, wherein the predetermined pressure includes the range of about five atmospheres to about twenty five atmospheres.

35. The furnace according to claim 24, wherein the predetermined pressure is at least five atmospheres.

36. A furnace for semiconductor material fabrication comprising:
a furnace tube having an interior surface for receiving and processing semiconductor material therein operable in a predetermined range of temperature and a predetermined range of pressure;
a gas feed coupled to the furnace tube introducing a gas into the furnace tube; and
a catalyst matrix located within a tube liner within the furnace tube contacting the gas introduced into the furnace tube, the catalyst matrix comprising a liner for a portion of the furnace tube including a first material having plurality of openings therein and a catalyst material covering at least a portion of the first material.

37. The furnace according to claim 36, wherein the predetermined range of temperature includes 600° C. and 750° C.

38. The furnace according to claim 36, wherein the catalyst matrix comprises:
a tube liner placed along a portion of a length of the interior surface of the furnace tube, the tube liner including a plurality of openings therein.

39. The furnace according to claim 38, wherein the tube liner comprises:
a base material having a plurality of openings formed therein; and
a catalyst material covering a portion of the base material.

40. The furnace according to claim 36, wherein the base material comprises stainless steel.

41. The furnace according to claim 36, wherein the catalyst material is selected from the group consisting of lead, platinum, iridium or palladium.

42. The furnace according to claim 36, wherein the catalyst material is selected from the group consisting of rhodium, nickel, or silver.

43. The furnace according to claim 36, wherein the predetermined pressure includes the range of about five atmospheres to about twenty five atmospheres.

44. The furnace according to claim 36, wherein the predetermined pressure is at least five atmospheres.

45. The furnace according to claim 36, further comprising a gas outlet connected to the furnace tube.

46. A furnace used in semiconductor material fabrication comprising:
   a furnace tube having an interior surface for receiving and processing semiconductor material therein operable in a predetermined range of temperature from about 600° C. to about 750° C. and a predetermined range of pressure;
   a gas feed coupled to the furnace tube introducing a gas into the furnace tube;
   a catalyst matrix located within a tube liner within the furnace tube contacting the gas; and
   a gas outlet coupled to the furnace tube for removing gas therefrom.

47. The furnace according to claim 46, wherein the predetermined range of temperature includes 600° C. and 750° C.

48. The furnace according to claim 46, wherein the catalyst matrix comprises:
   a tube liner placed along a portion of a length of the interior surface of the furnace tube, the tube liner including a plurality of openings therein.

49. The furnace according to claim 46, wherein a tube liner comprises:
   a base material having a plurality of openings formed therein; and
   a catalyst material covering a portion of the base material.

50. The furnace according to claim 49, wherein the base material is formed in a honeycomb configuration.

51. The furnace according to claim 49, wherein the base material is formed in a hexagonal configuration.

52. The furnace according to claim 49, wherein the base material comprises stainless steel.

53. The furnace according to claim 49, wherein the base material comprises a structural ceramic.

54. The furnace according to claim 49, wherein the catalyst material is selected from the group consisting of lead, platinum, iridium or palladium.

55. The furnace according to claim 49, wherein the catalyst material is selected from the group consisting of rhodium, nickel, or silver.

56. The furnace according to claim 46, wherein the predetermined pressure includes the range of about five atmospheres to about twenty five atmospheres.

57. The furnace according to claim 46, wherein the predetermined pressure is at least five atmospheres.

58. The furnace according to claim 46, further comprising:
   a gas outlet connected to the furnace tube.

59. A furnace in a process for semiconductor material comprising:
   a furnace tube having an interior surface for receiving and processing semiconductor material therein, the furnace tube operable in a predetermined range of temperature a predetermined range of pressure from about five atmospheres for the processing of semiconductor material therein;
   a gas feed coupled to the furnace tube introducing $N_2O$ gas into the furnace tube;
   a catalyst matrix located within a tube liner within the furnace tube, the catalyst matrix contacting the $N_2O$ gas; and
   a gas outlet coupled to the furnace tube for removing the $N_2O$ gas therefrom.

60. The furnace according to claim 59, wherein the predetermined range of temperature includes 600° C. and 750° C.

61. The furnace according to claim 59, wherein the catalyst matrix comprises:
   a tube liner placed along a portion of a length of the interior surface of the furnace tube, the tube liner including a plurality of openings therein.

62. The furnace according to claim 59, wherein a tube liner comprises:
   a base material having a plurality of openings formed therein; and
   a catalyst material covering a portion of the base material.

63. The furnace according to claim 62, wherein the base material is formed in a honeycomb configuration.

64. The furnace according to claim 62, wherein the base material is formed in a hexagonal configuration.

65. The furnace according to claim 62, wherein the base material comprises stainless steel.

66. The furnace according to claim 62, wherein the base material comprises a structural ceramic.

67. The furnace according to claim 62, wherein the catalyst material is selected from the group consisting of lead, platinum, iridium or palladium.

68. The furnace according to claim 62, wherein the catalyst material is selected from the group consisting of rhodium, nickel, or silver.

69. The furnace according to claim 59, wherein the predetermined pressure includes the range of about five atmospheres to about twenty five atmospheres.

70. The furnace according to claim 59, wherein the predetermined pressure is at least five atmospheres.

* * * * *

UNITED STATES PATENT AND TRADEMARK OFFICE
CERTIFICATE OF CORRECTION

PATENT NO. : 7,279,435 B2 Page 1 of 1
APPLICATION NO. : 10/933890
DATED : October 9, 2007
INVENTOR(S) : Gealy et al.

It is certified that error appears in the above-identified patent and that said Letters Patent is hereby corrected as shown below:

On the Title page, in field (75), in "Inventors", in column 1, line 1, delete "Daniel F. Gealy" and insert -- F. Daniel Gealy --, therefor.

In column 6, line 3, in Claim 26, after "portion of" insert -- a --.

Signed and Sealed this

Eighteenth Day of December, 2007

JON W. DUDAS
*Director of the United States Patent and Trademark Office*